(12) United States Patent
Odegard et al.

(10) Patent No.: US 6,977,429 B2
(45) Date of Patent: Dec. 20, 2005

(54) MANUFACTURING SYSTEM AND APPARATUS FOR BALANCED PRODUCT FLOW WITH APPLICATION TO LOW-STRESS UNDERFILLING OF FLIP-CHIP ELECTRONIC DEVICES

(75) Inventors: Charles A. Odegard, McKinney, TX (US); Vinu Yamunan, Dallas, TX (US); Tz-Cheng Chiu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/729,128

(22) Filed: Dec. 5, 2003

(65) Prior Publication Data

US 2005/0124090 A1    Jun. 9, 2005

(51) Int. Cl.[7] .............................................. H01L 23/02
(52) U.S. Cl. ...................................... 257/685; 257/778
(58) Field of Search ............................... 257/685, 686, 257/723, 731, 737, 738, 778

(56) References Cited

U.S. PATENT DOCUMENTS

| | | | |
|---|---|---|---|
| 4,989,444 A | * | 2/1991 | Murakami et al. ............ 72/422 |
| 5,779,425 A | * | 7/1998 | Grutzediek et al. ..... 414/416.05 |
| 6,228,680 B1 | | 5/2001 | Thomas |
| 6,591,161 B2 | * | 7/2003 | Yoo et al. .................... 700/218 |

* cited by examiner

*Primary Examiner*—Phuc T. Dang
(74) *Attorney, Agent, or Firm*—Yingsheng Tung; Wade James Brady, III; Frederick J. Telecky, Jr.

(57) ABSTRACT

A system (100) for manufacturing product, in which a first work station (101) is operable to perform a first manufacturing action on the product parts; this first station has a first entrance (101*a*) and a first exit 101*b*). A second work station (102) is operable to perform a second manufacturing action on the product parts; this second station has a second entrance (102*a*) and a second exit (102*b*). A transport line (103) between the first exit and the second entrance is operable to move the product parts under computer control. A chamber (104) encloses a portion of the line and is constructed so that the transport achieves a balanced throughput from the first station to the second station, while the product parts are exposed to computer-controlled environmental conditions (110) during transport through the chamber. The balanced throughput in the chamber is achieved by waiting lines for the product with computer-controlled monitors (105*a*) for product parts' positions and times in the chamber.

7 Claims, 5 Drawing Sheets

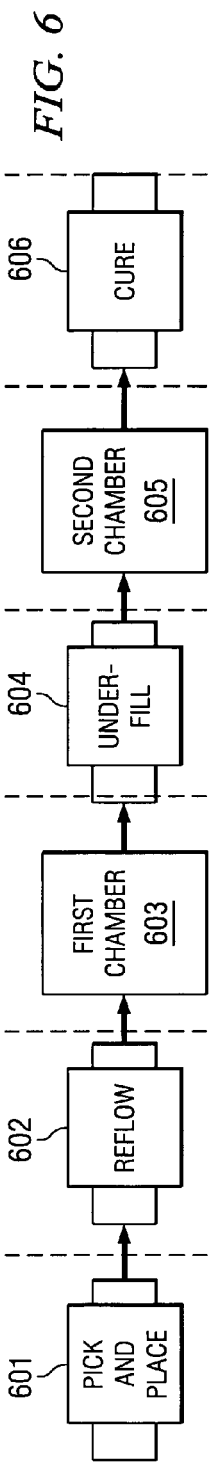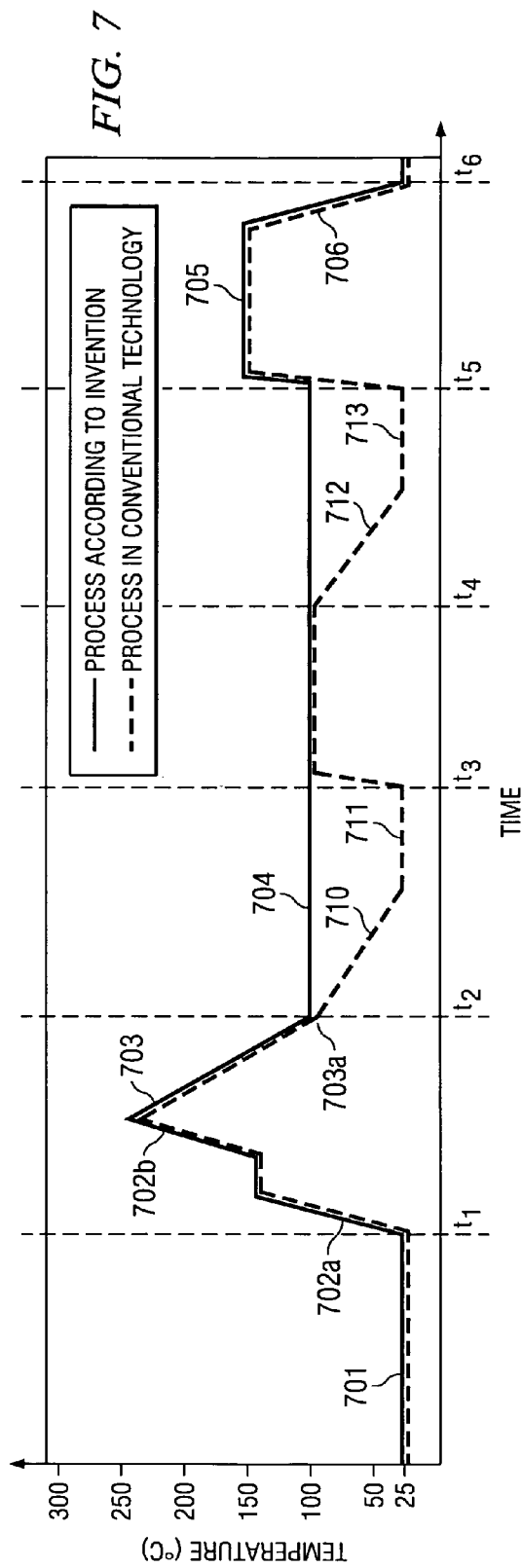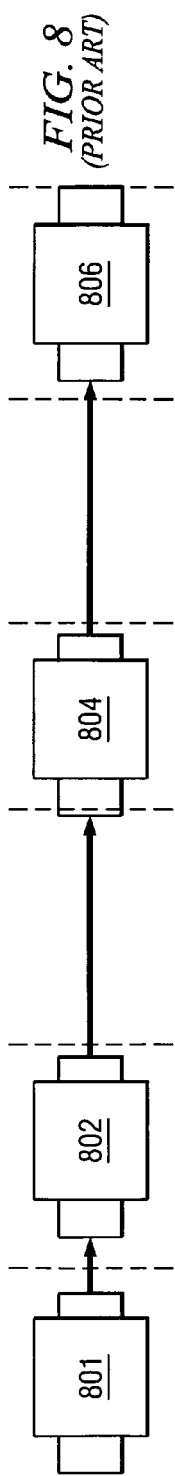

LOCATION A IS (2.85, 3.04) mm FROM CENTER OF DIE
LOCATION B IS (3.04, 3.23) mm FROM CENTER OF DIE

MANUFACTURING SYSTEM AND APPARATUS FOR BALANCED PRODUCT FLOW WITH APPLICATION TO LOW-STRESS UNDERFILLING OF FLIP-CHIP ELECTRONIC DEVICES

FIELD OF THE INVENTION

The present invention is related in general to the field of electronic systems and semiconductor devices and more specifically to an apparatus for enhancing process control and reducing thermomechanical stress in the assembly of semiconductor devices.

DESCRIPTION OF THE RELATED ART

When an integrated circuit (IC) chip is assembled on an insulating substrate with conducting lines, such as a printed circuit board, by solder bump connections, the chip is spaced apart from the substrate by the bumps, thereby forming a gap between the chip and substrate. The IC chip is typically a semiconductor such as silicon, silicon germanium, or gallium arsenide, the substrate is usually made of ceramic or polymer-based materials such as FR-4. Consequently, there is a significant difference between the coefficients of thermal expansion (CTE) of the chip and the substrate; for instance, with silicon (about 2.5 ppm/° C.) as the semiconductor material and plastic FR-4 (about 25 ppm/° C.) as substrate material, the difference in CTE is substantially an order of magnitude. As a consequence of this CTE difference, thermomechanical stresses are created at the solder interconnections, especially in the regions of the joints, when the assembly is subjected to temperature cycling during device usage or reliability testing. These stresses tend to fatigue the joints and the bumps, resulting in cracks and eventual failure of the assembly.

In order to distribute the mechanical stress and to strengthen the solder joints without affecting the electrical connection, the gap between the semiconductor chip and the substrate is customarily filled with a polymeric material, which encapsulates the bumps and fills the gap. For example, in the well-known "C-4" process developed by International Business Machines Corporation, polymeric material is used to fill the gap between the silicon chip and the ceramic substrate.

The encapsulant is typically applied after the solder bumps have undergone the reflow process and formed the metallic joints for electrical contact between the IC chip and the substrate. A viscous polymeric precursor, sometimes referred to as the "underfill", is dispensed onto the substrate adjacent to the chip and is pulled into the gap by capillary forces. The precursor is then heated, polymerized and "cured" to form the encapsulant.

It is well known in the industry that the temperature cycling needed for this curing process can create thermomechanical stress on its own, which may be detrimental to the chip and/or the solder interconnections. For example, the stress created by a cooling step after reflow just prior to the underfill process, and by cooling after the underfill curing step may delaminate the solder joint, crack the passivation of the chip, or propagate fractures into the circuit structures. In general, the sensitivity to cracking of the layered structures of integrated circuits increases strongly with decreasing thickness of the various layers and increasing mechanical weakness of low dielectric constant insulators.

Consequently, a need has arisen for an assembly methodology in which the stress-distributing benefits of the underfill material can be enjoyed without the deleterious side-effects of the underfilling process, resulting in enhanced device reliability. The methodology should be coherent, low-cost, and flexible enough to be applied to different semiconductor product families and a wide spectrum of design and process variations. Preferably, these innovations should be accomplished while shortening production cycle time and increasing throughput. New equipment design should be general enough to provide a fabrication advantage for the product at various steps of the process flow.

SUMMARY OF THE INVENTION

One embodiment of the invention is a system for manufacturing a product, in which a first work station is operable to perform a first manufacturing action on the unfinished product piece parts; this first station has a first entrance and a first exit. A second work station is operable to perform a second manufacturing action on the product parts; this second station has a second entrance and a second exit. A product transport line between the first exit and the second entrance is operable to move the product parts under computer control. A chamber encloses a portion of the line and is constructed so that the transport achieves a balanced throughput from the first station to the second station, while the product parts are exposed to computer-controlled environmental conditions during transport through the chamber.

The transport line comprises a mechanical system with movable platforms or pallets for holding the product parts. The balanced throughput in the chamber is achieved by waiting lines for the product parts with computer-controlled monitors for tracking the position and time of parts in the chamber. An example of such products is semiconductor devices.

Another embodiment of the invention is a chamber for receiving, storing, transmitting and releasing manufactured products; this chamber may be inserted into the manufacturing flow at various stages of product fabrication. The chamber maintains specified environments, such as gaseous ambient, humidity, and temperature. The chamber has computer-controlled inlets and outlets with sensors, and a transport system connecting inlets and outlets. The transport system includes movable platforms suitable for transporting product or parts; the system is designed to create waiting lines for the product parts loaded on the platforms by the use of horizontally rotating carousels, or vertically rotating wheels, or elongated conveyor systems. Computer-controlled monitors track the position and time of the platforms to achieve a balanced throughput.

Another embodiment of the invention is a method for stress-reduced assembly of a semiconductor device including a chip having at least one contact pad and a substrate having at least one terminal pad. First, the substrate is placed on a pallet; and a reflow element, such as a solder ball, is attached to the chip contact pad. The chip is then flipped onto the substrate so that the reflow element is placed in contact with the substrate terminal pad. Second, the pallet is moved into a first workstation suitable to perform reflow operations, where thermal energy is applied to chip and substrate to reflow the solder ball, creating an assembly of chip and substrate spaced apart by a gap. The pallet including the assembly is then transferred from the first workstation into a first chamber maintained at a constant first temperature; and the pallet is positioned in a waiting line for a first period of time.

On command, the pallet is withdrawn from said waiting line and moved into a second workstation suitable to perform underfill operations, where the assembly gap is filled with a polymer precursor. Next, the pallet including the filled assembly is moved from the second workstation into a second chamber maintained at a constant second temperature sufficient to partially polymerize the precursor; the pallet is positioned in a waiting line for a second period of time.

On command, the pallet is withdrawn from the waiting line and moved into a third workstation suitable to complete the polymerization of the precursor, where the precursor is completely polymerized. Finally, the completed assembly is cooled to ambient temperature. All heating and cooling steps are performed at computer-controlled ramp rates. The temperature ramps, together with the constant temperature waiting periods, are designed to relieve thermomechanical stress.

Embodiments of the present invention are related to solder-ball and bump-bonded IC assemblies, semiconductor device packages, surface mount and chip-scale packages. It is a technical advantage that the invention offers a flexible and high-throughput assembly methodology resulting in very low-stress, reliable products. It is an additional technical advantage that the invention uses a chamber for balancing the production line flow, which is general enough in its concept and features that it permits insertion into the production flow at various stages of the flow. Further technical advantages include the opportunity to scale the assembly to smaller dimensions and mechanically weaker materials, supporting the ongoing trend of IC miniaturization, and to distribute the chip contacts more evenly over the chip area rather than restricting the contacts to a linear arrangement along the chip perimeters, supporting the ongoing trend towards higher input/output count.

The technical advantages represented by certain embodiments of the invention will become apparent from the following description of the preferred embodiments of the invention, when considered in conjunction with the accompanying drawings and the novel features set forth in the appended claims.

BRIEF DESCRIPTION OF THE DRAWINGS

FIG. 6 depicts an assembly process flow for semiconductor devices, including two storage chambers, according to an embodiment of the invention.

FIG. 7 shows the temperature profile versus time of the assembly flow of a product moving through the stages displayed in FIG. 6; for comparison, the temperature profile of a product moving through the conventional assembly stages displayed in FIG. 8, is also shown.

FIG. 8 depicts an assembly process flow for semiconductor devices according to conventional technology.

DETAILED DESCRIPTION OF THE PREFERRED EMBODIMENTS

The present invention is related to U.S. Pat. No. 6,213,347, issued Apr. 10, 2001, and U.S. Pat. No. 6,228,680, issued May 8, 2001 (Thomas, "Low Stress Method and Apparatus for Underfilling Flip-Chip Electronic Devices"); and U.S. Pat. No. 6,245,583, issued Jun. 12, 2001 (Amador et al., "Low Stress Method and Apparatus of Underfilling Flip-Chip Electronic Devices").

Figure 1:
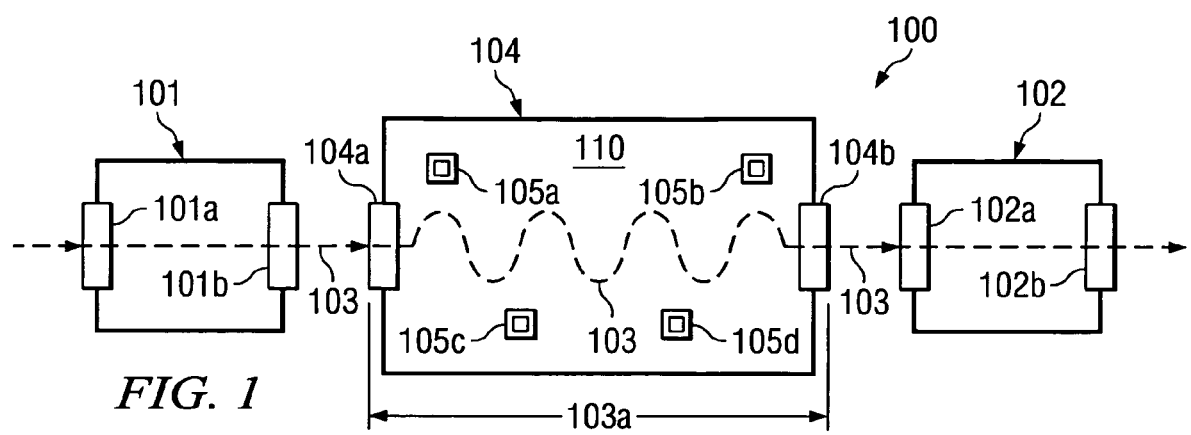
FIG. 1 is a schematic diagram of a portion of the manufacturing system and apparatus for balanced product flow according to an embodiment of the invention.

To illustrate an embodiment of the invention, FIG. 1 depicts schematically a group 100 of workstations and other systems as they are arranged consecutively to form a portion of the fabrication process flow for certain products. The direction of the manufacturing flow is indicated in FIG. 1 by the dashed arrows 103. An example of such product and fabrication flow in semiconductor technology is the assembly of integrated circuit chips onto substrates using the flip-chip process.

In FIG. 1, a first workstation 101 has a first entry 101a and a first exit 101b. Workstation 101 serves to perform a specific manufacturing action on the product. In the technology of semiconductor device fabrication the action may, for example, be the reflowing of solder interconnections. A second workstation 102 has a second entry 102a and a second exit 102b. Workstation 102 serves to perform another specific manufacturing action on the product, subsequent to the action of workstation 101. In the technology of semiconductor device fabrication, the action may, for example be the dispensing of underfill precursors.

Product transport line 103 connects first exit 101b and second entry 102a. The transport line provides means to move product parts from exit 101b to entry 102a under computer control; for example, transport line 103 may be a mechanical rail line operable to move pallets or platforms holding the workpieces. For instance, the product parts loaded onto the pallets may be semiconductor device parts, which need to undergo fabrication steps.

Chamber 104 encloses the portion 103a of transport line 103. Chamber 104 has an entry 104a, which faces the exit 101b of first workstation 101, and an exit 104b, which faces the entry 102a of second workstation 102. This chamber 104 provides an environment 110 for the line portion 103a, which is under computer-controlled conditions. Examples for these environmental conditions include gaseous ambient, gaseous pressure, humidity, and temperature (more detail see FIGS. 2 to 4). Furthermore, the transport line 103a within chamber 104 is structured and computer-controlled to achieve a balanced, coordinated throughput of parts from first workstation exit 101b to second workstation entrance 102a. One feature of the transport line is the formation of waiting lines for the product parts within chamber 104; another feature is that they may facilitate certain fabrication steps, which have as a characteristic feature the time spent under defined environmental conditions such as temperature. Several examples of suitable transport line configurations are described in FIGS. 2 to 4.

The balanced-line transport through chamber 104 is maintained by monitors, which sense specific conditions such as the temperature and/or the concentration of gases released in polymerization processes. Schematically, a few monitors are exemplified by 105a, 105b, 105c, and 105d in chamber 104 of FIG. 1. These monitors are controlled by computers and provide data and feedback to computers.

Another embodiment of the invention is a chamber for receiving, storing, transmitting and releasing manufactured product; the chamber is constructed so that it may be inserted into the manufacturing flow at various stages of product fabrication, sometimes with minor variations of one or more of its characteristics. Examples of suitable chambers are depicted in the schematic FIGS. 2, 3 and 4. The black arrows in each chamber indicate the general direction of the product flow through the chamber from its respective entry to its respective exit.

Figure 2:
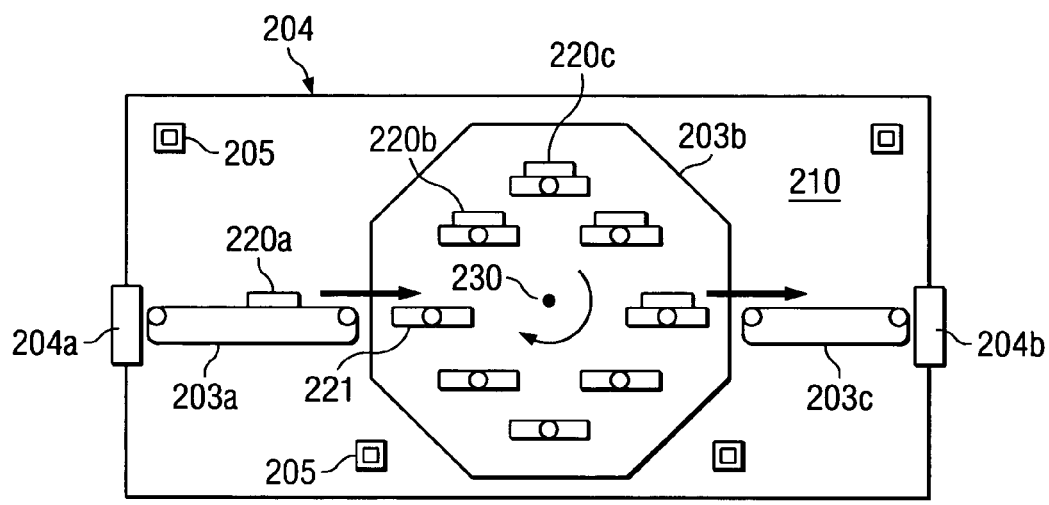
FIG. 2 is a schematic cross section of a chamber for receiving, storing, transmitting and releasing manufactured product according to another embodiment of the invention.

Referring now to FIG. 2, it shows a schematic cross sectional view of chamber 204 with entry 204a and exit 204b. A product transport line connects entry 204a and exit 204b. In FIG. 2, the product transport line through the chamber is indicated in three sections: Sections 203a and 203c may comprise linear portions, or may have another outline, and section 203b is a product waiting portion. This example of waiting portion 203b is a wheel rotatable vertically around axis 230 (which is perpendicular to the plane of wheel 203b). The transport system may have movable platforms, or pallets, suitable for transporting the product parts.

When a product unit or part (for instance, product on a pallet) 220a has moved from entry 204a to wheel 203b, it may access a position on the wheel and spend a pre-determined amount of time on the rotating wheel; in FIG. 2, several more product parts or units 220b, 220c, etc., are indicated. The wheel and its product holders 221 accommodate the product parts as they enter chamber 204. Position and dwell time for each product or part is monitored by sensors, which feed back data to the computer in control of the waiting time. A few sensors 205 are schematically indicated in FIG. 2. The monitored position and dwell time data of the product units are inputs needed to enable a computer-balanced product throughput through chamber 204. In order to add flexibility, some chambers may have multiple wheels, possibly rotatable at different speeds.

A variety of additional features make chamber 204 flexible for insertion into various stages of product fabrication. In applications where the product is a semiconductor device and the fabrication process is the assembly of an integrated circuit chip onto a substrate, or the assembly of a packaged device onto a substrate, chamber 204 may feature an environment of computer-controlled gaseous ambient, gaseous pressure, and humidity; furthermore, chamber 204 may provide computer-controlled temperature. These environmental conditions may stay constant or may change in a predetermined fashion or rhythm. In FIG. 2, these environmental conditions are generally designated 210.

Figure 3:
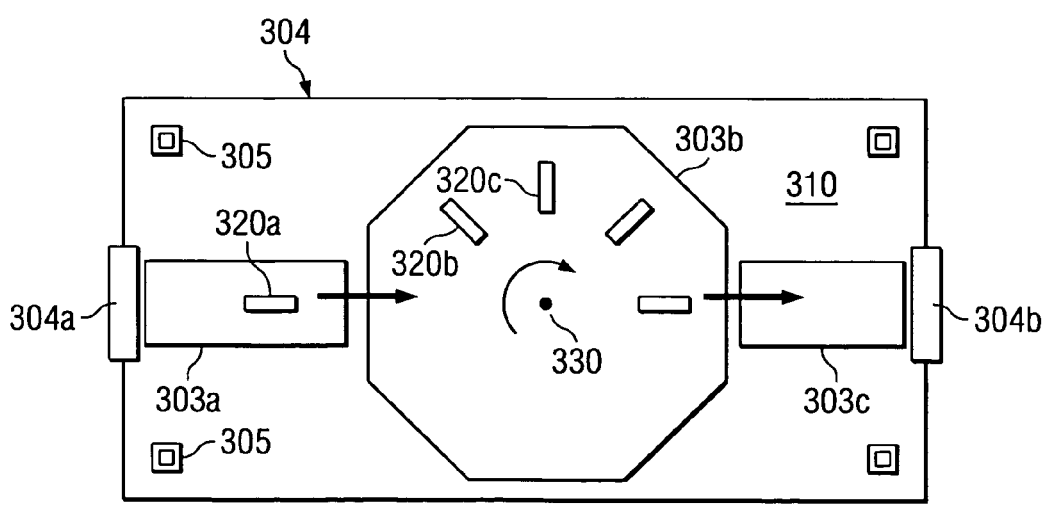
FIG. 3 is a schematic top view of a chamber for receiving, storing, transmitting and releasing manufactured product according to another embodiment of the invention.

FIG. 3 shows a top view of chamber 304 with entry 304a and exit 304b. A transport line connects entry 304a and exit 304b. In FIG. 3, the product transport line through the chamber is indicated in three sections. Sections 303a and 303c may comprise linear portions, or may have another outline, and section 303b is a product waiting portion. Waiting portion 303b of this embodiment is a carousel rotating horizontally around axis 330 (which is perpendicular to the plane of carousel 303b). The transport system may have movable platforms, or pallets, suitable for transporting the product parts.

When a product part or unit (for instance, product on a pallet) 320a has moved from entry 304a to carousel 303b, it may access the carousel and spend a pre-determined amount of time on the rotating carousel; in FIG. 3, several more product units 320b, 320c, etc., are indicated. The carousel accommodates the specific products intended for chamber 304. Position and dwell time for each product is monitored by sensors, which feed back data to the computer in control of the waiting time. A few sensors 305 are schematically indicated in FIG. 3. The monitored position and dwell time data of the product units are inputs needed to enable a computer-balanced product throughput through chamber 304. In order to add flexibility, some chambers may have multiple carousels, possibly rotatable at different speeds.

Similar to the embodiment described in FIG. 2, a variety of additional features make chamber 304 in FIG. 3 flexible for insertion into various stages of product fabrication. In applications where the product is a semiconductor device and the fabrication process the assembly of an integrated circuit chip onto a substrate, or the assembly of a packaged device onto a substrate, chamber 304 may feature an environment of computer-controlled gaseous ambient, gaseous pressure, and humidity; furthermore, chamber 304 may provide computer-controlled temperature. These environmental conditions may stay constant or may change in a predetermined fashion or rhythm. In FIG. 3, these environmental conditions are generally designated 310.

Figure 4:
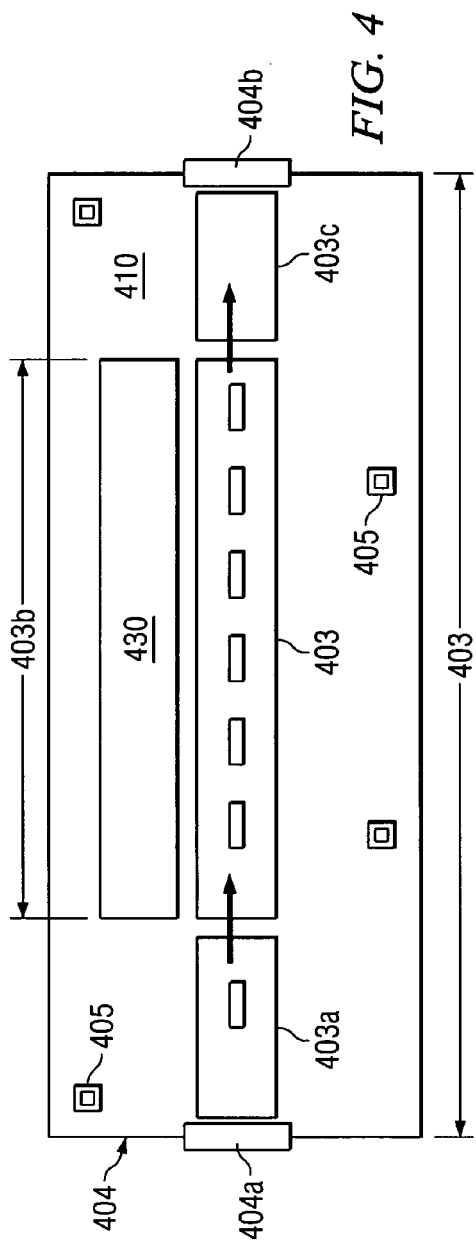
FIG. 4 shows a schematic top view of a chamber for receiving, storing, transmitting and releasing manufactured product according to yet another embodiment of the invention.

FIG. 4 shows a schematic top view of another apparatus for receiving, storing, transmitting and releasing manufactured products or parts. The apparatus is suitable for insertion into the manufacturing flow at various stages of product fabrication. In terms of chamber capabilities and flexibility, the apparatus of FIG. 4 is similar to the embodiments discussed in FIGS. 2 and 3.

In terms of product storage, however, the apparatus of FIG. 4 comprises a plurality of linear, yet long product waiting lines. Referring to FIG. 4, the chamber 404 has a product transport line 403 connecting the computer-controlled entry 404a and exit 404b. After entering the chamber, a product or part is transported along a first conveyor 403a. It then enters the waiting portion 403b of the transport line, which is designed as a plurality of linear stretches 430, which can store movable platforms, or pallets, loaded with product or parts for any pre-determined period of time. These line portions have the option of moving as a conveyor belt. For embodiments with multiple line portions, each belt may move at a different speed. On command, the product finally leaves the chamber on the third conveyor 403c and the exit door 404b. Position and time of stay are computer-controlled. The monitors supplying data to the computer are generally designated 405. The environmental conditions 410 of the chamber include computer-controlled gaseous ambient, pressure, and humidity, as well as temperature.

Figure 5:
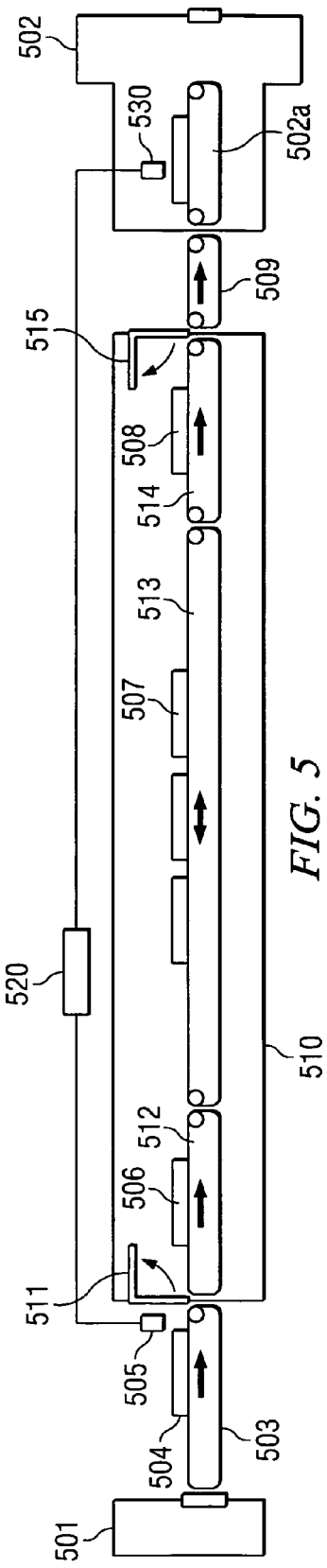
FIG. 5 shows a more detailed schematic cross section of a chamber for receiving, storing, transmitting and releasing manufactured product.

An embodiment of the apparatus of FIG. 4, inserted into a semiconductor device assembly line between a reflow oven 501 and an underfill dispense equipment 502, is illustrated schematically in FIG. 5 (several types of reflow ovens and underfill dispensing systems are commercially available; for the preferred underfill techniques, see the U.S. patens quoted above). Conveyor 503 is operable to deliver pallets 504 for an automatic transfer into the heated chamber 510. A position sensor 505, which is mounted on the output conveyor 503 of the reflow oven, detects the presence of incoming pallet units, such as pallet 504. The sensor transmits an electrical signal to the computer 520 controlling chamber 510. A trap door 511 swings open to allow direct transfer of the pallet 504 from the output conveyor 503 of reflow oven 501 onto the input conveyor 512 of chamber 510. Trap door 511 closes once the transfer of pallet 504 is complete. Chamber 510 is characterized by controlled ambient and controlled temperature (preferably an elevated temperature, see FIG. 7).

From the input conveyor 512, pallet 506 is transferred to the central conveyor 513. In the embodiment of FIG. 5, central conveyor 513 has bi-directional movement, so that incoming pallets can be placed immediately (keeping the input conveyor clear to receive the next available pallet), and the first-in pallet 507 can be placed onto the output conveyor 514 on demand. Trap door 515 swings open to allow direct transfer of pallet 508 from output conveyor 514 of chamber 510 onto input conveyor 509 of underfill dispense equipment 502. Trap door 515 closes once transfer is complete (of the tools inside the underfill dispense equipment, FIG. 5 shows only preheat stage 502a). Position sensor 530, mounted above preheat stage 502a, detects availability to receive the next pallet. Sensor 530 transits an electrical signal to computer 520 controlling chamber 510. By means of data feedback and computer control, the system of FIG. 5 establishes a balanced product flow and fabrication time flexibility.

The embodiment illustrated in FIG. 6, schematically showing the solder reflow and device underfill fabrication system, is arranged so that the corresponding temperature vs. time profile can be displayed in FIG. 7. Starting with the pick-and-place equipment 601 at ambient temperature (curve portion 701), the product parts move to the reflow oven 602 and undergoes the reflow process. The reflow process is schematically depicted as having a heat-up cycle in two stages 702a and 702b, followed by a partial cool down cycle 703, together stretching the period from Time t1 to Time t2 (the actual heating and cooling cycles depend on the reflow material selected). The partial cooldown temperature 703a is preferably 90 to 120° C., significantly above ambient temperature.

The product parts remain a considerable period of time at the temperature, which it has reached at point 703a: First, the flexible period of time from t2 to t3, which the product parts spend in first chamber 603 (the attributes of chamber 603 are described in more detail in conjunction with FIG. 5); then the period of time from t3 to t4, which the product needs for receiving the underfill precursor in the dispense equipment 604; and finally the period of time from t4 to t5, which the product spends in second chamber 605 (the attributes of chamber 605 are similar to the features described in FIG. 5). The product enters the underfill cure oven 606 and spends the time period from t5 to t6 at a somewhat elevated temperature 705 (dependent on the underfill material selected) in order to fully polymerize the underfill precursor. After leaving the cure oven 606, the product temperature is cooled to ambient temperature in ramp cycle 706.

In FIG. 7, the technical advantage of the time/temperature diagram (solid curve) achieved by the embodiment of FIG. 6 is contrasted with the time/temperature diagram (dotted curve) typical for conventional technology. The latter diagram is characterized by deep cooling cycles to ambient temperature, curve portions 710 and 711, and 712 and 713, respectively. These deep cooling cycles create thermo-mechanical stress in the solder joints and the adjacent dielectric material of such magnitude that these device zones are endangered by fracture and failure (see FIGS. 10 and 11). In FIG. 8, a typical example of an assembly production line based on known technology is schematically depicted. The product moves from the pick-and-place equipment 801 into the reflow oven 802; the product may then wait in a staging line to be cooled to ambient temperature. After receiving the underfill precursor in the dispense equipment 804, the product may wait again in a staging line to be cooled to ambient temperature. The underfill precursor is polymerized in cure oven 806, before the completed product is finally cooled to ambient temperature.

Another embodiment of the present invention is a method for stress-reduced assembly of a semiconductor device. The device may comprise an integrated circuit chip flip-assembled on a substrate, or is may comprise a packaged unit attached to a substrate by reflow connections. An example of this method is schematically illustrated the process flow diagram of FIG. 9.

One input to the process flow is piece part 901 consisting of a semiconductor chip having at least one contact pad; an example is a silicon integrated circuit with a metal pad having a solderable or weldable surface; another example is a packaged semiconductor device with a metal pad having a solderable surface. Preferred solderable surfaces include nickel or palladium surfaces. Another input is piece part 902 consisting of a reflowable element such as a solder ball or a tin bump. Preferred reflowable elements, or connectors, are made of tin/silver, tin/bismuth, or tin/lead. Another input is piece part 903 consisting of a substrate having at least one terminal pad with a solderable surface; a preferred example is an FR-4 printed circuit board with a gold-clad copper pad. Another input is piece part 904 consisting of a movable platform suitable for transporting a semiconductor device; an example is a pallet.

In process step 905, the reflow element 902 is attached to the contact pad of chip 901; the preferred attachment technique is reflowing the connector element onto the pad. In step 906, the substrate 903 is placed on pallet 904.

In step 907, chip 901 with the attached reflow element 902 is flipped onto substrate 903, located on pallet 904, so that reflow element 902 is placed in contact with the terminal pad of substrate 903. In the next step, the pallet is moved into the first workstation 908. This workstation is an apparatus suitable to perform reflow operations; a preferred apparatus is a computer-controlled reflow oven with automatic chain-link throughput. In this first workstation 908, thermal energy is supplied to chip 901 and substrate 903 on the pallet in an amount sufficient to reflow the element 902. This step 909 of solder melting creates an assembly of chip 901 and substrate 902 spaced apart by a gap, with the reflow connectors as spacing entities. While the connectors are allowed to solidify in the first workstation 908, their temperature should not drop significantly below the melting temperature, definitely not to room temperature.

Without delay, the pallet loaded with the chip/substrate assembly is transferred from workstation 908 into the first chamber 910. During this transfer, the temperature of the chip/substrate assembly will not drop substantially. First chamber 910 is constructed like one of the apparatus described in FIGS. 2, 3, and 4. The newly arrived pallet is positioned in a waiting line for a first period of time. During this waiting period of time, the temperature of the assembly is constant and maintained at a level such that there is little build-up of thermo-mechanical stress at the solder joints of the assembly. Position of the pallet, temperature, environmental conditions, and time are monitored by sensors and controlled by computer.

In the next process step, the pallet with the assembly are withdrawn from the waiting line in first chamber 910 and moved into a second workstation 911. This workstation is an apparatus suitable to perform underfilling operations; a preferred apparatus consists of an ambient- and temperature-controlled chamber with computer-controlled syringes designed in positions and nozzles openings to dispense underfill precursors at a pre-determined rate. In step 912, the precursor fills the gaps of the chip/substrate assembly by capillary force at a controlled rate. Preferred underfill precursors include polymers such as acid anhydride epoxy or cyanoester; for these polymers, the temperature of the chip/substrate assembly should preferably be in the range from 90 to 120° C.

After the underfilling process, the pallet with the filled assembly is transferred from the second workstation 911 into a second chamber 913. The second chamber 913 is constructed like one of the apparatus described in FIGS. 2, 3, and 4. The newly arrived pallet is positioned in a waiting line for a second period of time. During this waiting period of time, the temperature of the assembly is constant and maintained at a level sufficient to at least partially polymerize the underfill polymer precursor. Position of the pallet, temperature, environmental conditions, and time are monitored by sensors and controlled by computer.

Next, the pallet loaded with the underfilled assembly is withdrawn from the waiting line and moved into a third workstation 914 suitable to complete the polymerization of the underfill polymer. Process step 915 indicates the completion of the polymerization (often referred to as polymer curing) and thus the assembly of the flip-chip onto the substrate.

The completed assembly exits the third workstation 914 and is cooled in step 916 to ambient temperature. During the whole process flow of FIG. 9, the heating and cooling steps are performed at computer-controlled ramp rates and waiting times to avoid the build-up of thermo-mechanical stress, or to relieve existing stress. The completed assembly is finally ready for shipment (917).

Figure 9:
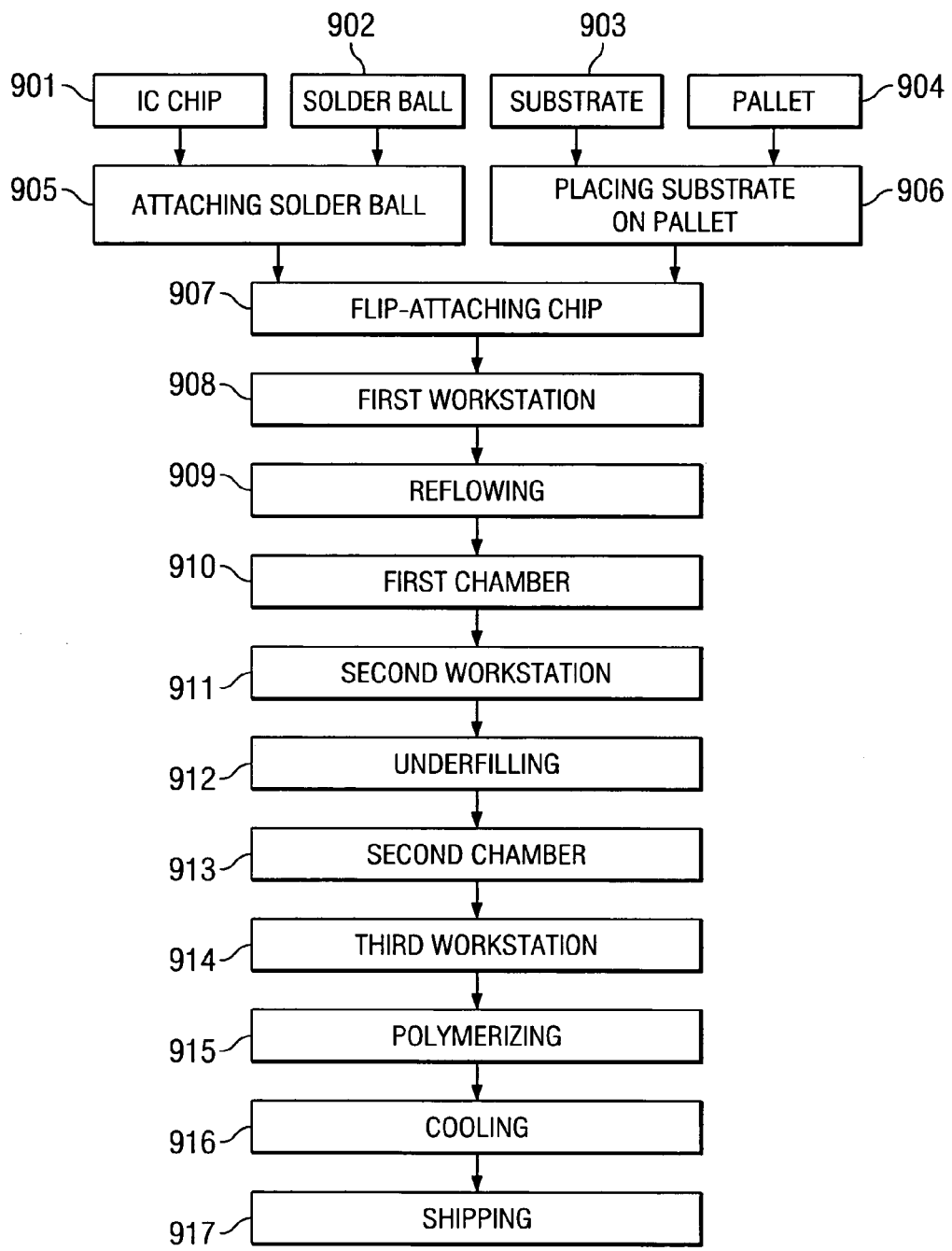
FIG. 9 is a schematic process flow diagram of an embodiment of the invention applied to low-stress underfilling of flip-chip electronic devices.

The technical advantage of the assembly process flow as illustrated in FIG. 9, wherein the temperature profile is computer-controlled and a drop to ambient temperature after one or more process steps is avoided, can be corroborated by finite-element modeling of the thermo-mechanical stress distribution in solder joints and adjacent dielectric materials.

Figure 10:
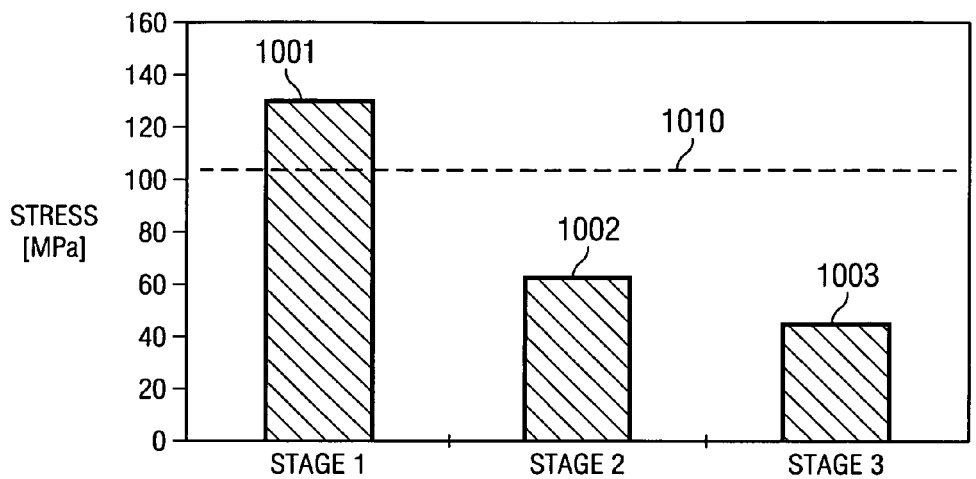
FIG. 10 compares the modeled stress in low-k interlevel dielectrics, exerted by process temperatures in the assembly of semiconductor devices, for different assembly stages.

In FIG. 10, the average tensile stress, measured in megapascals, MPa, of a solder connection is plotted for three stages in the assembly process: Stage 1001 is the stress value after the chip has been solder attached to the substrate and cooled from reflow temperature to ambient temperature, before underfilling. Stage 1002 is the stress value after the chip has been solder attached to the substrate and cooled from reflow temperature to about 90° C., before underfilling. Stage 1003 is the stress value after the chip has been solder attached to the substrate, cooled to only 90° C., underfilled, cured, cooled to ambient temperature, and operated under operating conditions. Dotted line 1010 marks the approximate maximum tensile strength, which typical low-k inter-level dielectric materials, as used in advanced integrated circuits, can tolerate; as can be seen in FIG. 10, the tensile strength limit is about 105 MPa. This means that, for the process leading to Stage 1, there is a significant risk of interlevel dielectric layer cracking, because this process encounters stress levels considerably higher than the material tolerance. On the other hand, the embodiments of the invention, leading to Stage 2, avoid this risk.

Figure 11A:
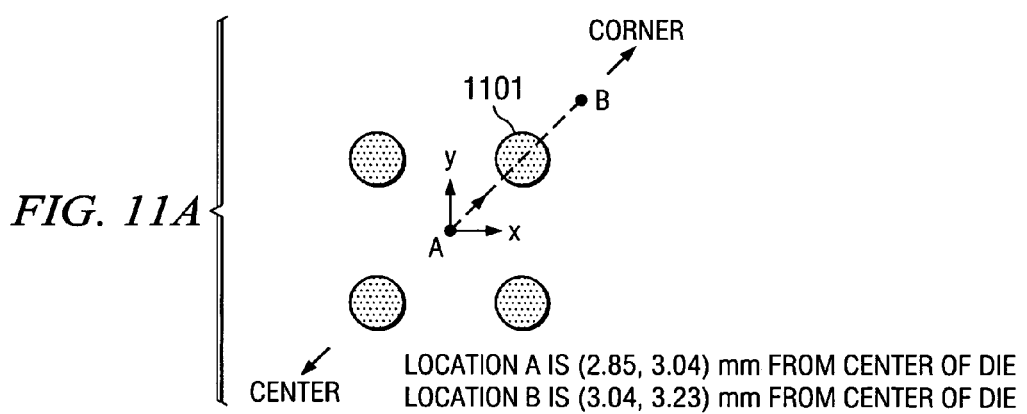
FIG. 11A is a schematic top view of a plurality of solder balls showing parameters used in stress modeling.
Figure 11B:
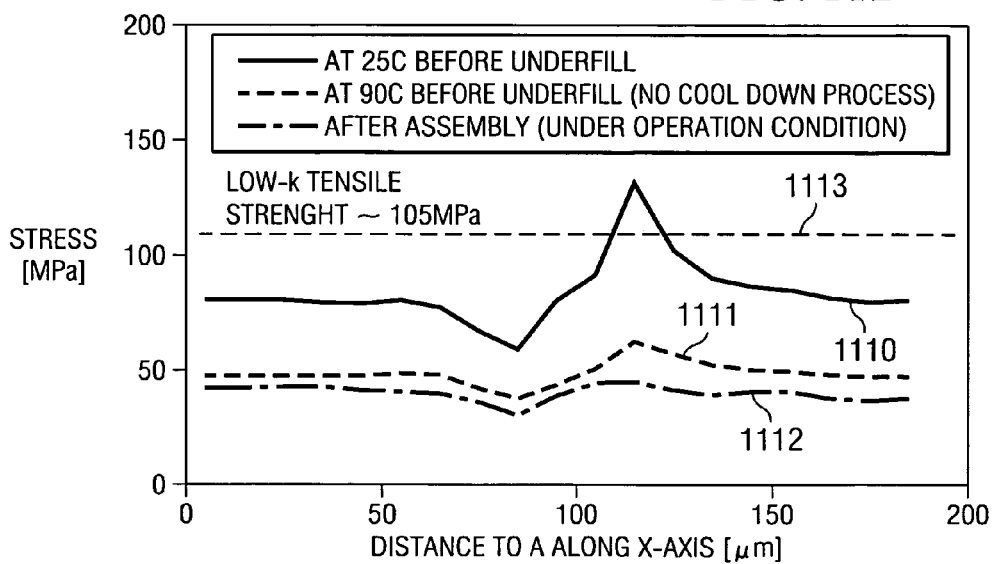
FIG. 11B compares the geometrical variation of modeled stress in low-k interlevel dielectrics, exerted by process temperatures for different assembly stages of semiconductor devices.

FIGS. 11A and 11B illustrate modeling results for specifically selected solder balls of a chip to be assembled to a substrate; these modeling results corroborate the advantage of the apparatus and method embodiments of the invention. FIG. 11A displays a plurality of solder balls attached to a semiconductor chip; the solder ball closest to the chip corner is designated 1101 (corner ball). The tensile stress exerted on these solder balls at various stages of assembly and temperature exposures is calculated along a line reaching from the chip center to the chip corner. Along this line are several solder balls, including the extreme corner ball 1101, and points A and B. For point A, an x-y coordinate system is marked for reference.

In FIG. 11b, the calculated tensile stress (expressed in MPa) is plotted as a function of the distance to point A along the x-axis (expressed in $\mu$m). The stress is calculated for three fabrication situations: Curve 1110 marks the stress at ambient temperature after cooling from the reflow temperature and before the step of underfilling (conventional fabrication method). Curve 1111 marks the stress at 90° C. maintained after reflow temperature and before the underfilling step (method of the invention). Curve 1112 marks the stress under operating conditions after completion of the assembly. Line 1113 indicates the approximate stress limit (about 105 MPa) of the low-k dielectric materials, which are used as inter-level insulators in high-speed advanced integrated circuits.

It is evident from curve 1110 that there are risk zones close to the chip corner, where the stress created by temperature swings in the conventional fabrication process exceeds the tensile strength of IC dielectrics. Consequently, it is probable that cohesive cracking of the inter-level dielectric will occur within this stress zone. This dangerous stress peak and the risk of cracking are especially pronounced in the vicinity of the corner solder connection 1101 in FIG. 11A.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description.

As an example, the process flow diagram of FIG. 9 can be applied to assembly processes wherein a packaged semiconductor device is substituted for the IC chip shown in FIG. 9. Consequently, this embodiment of the invention applies to ball grid array packages, chip-scale packages, and chip-size packages.

It is therefore intended that the appended claims encompass all such modifications and embodiments.

We claim:

1. An apparatus, comprising:
    a computer-controlled chamber for maintaining an internal temperature having an entry and exit;
    a transport system connecting said entry and exit for transporting a product into and out of the chamber;
    a computer-controlled reflow station connecting to the chamber, having a reflow-temperature profile with a end-point temperature higher than room-temperature; and
    the internal temperature of the computer-controlled chamber comparable to the end-point temperature.

2. The apparatus according to claim 1 wherein said computer-controlled chamber maintains environments include computer-controlled gaseous ambient and humidity.

3. The apparatus according to claim 1 wherein said product comprises flip-chip semiconductor devices on substrates.

4. The apparatus according to claim 1 wherein the chamber comprises horizontally rotatable carousels adapted to carry flip-chip semiconductor devices on substrates.

5. The apparatus according to claim 1 wherein the chamber comprises vertically rotatable wheels adapted to carry flip-chip semiconductor devices on substrates.

6. The apparatus according to claim 1 wherein the chamber comprises elongated conveyor systems adapted to carry flip-chip semiconductor devices on substrates.

7. The apparatus according to claim 1 further comprising sensors.

* * * * *